(12) United States Patent
Kuo et al.

(10) Patent No.: US 12,471,356 B2
(45) Date of Patent: Nov. 11, 2025

(54) STEPPED ISOLATION REGIONS

(71) Applicant: Taiwan Semiconductor Manufacturing Company, Ltd., Hsinchu (TW)

(72) Inventors: Hui Hung Kuo, Kaohsiung (TW); Hsin Fu Lin, Hsinchu (TW); Hsin Heng Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 401 days.

(21) Appl. No.: 18/169,928

(22) Filed: Feb. 16, 2023

(65) Prior Publication Data

US 2024/0282636 A1 Aug. 22, 2024

(51) Int. Cl.
| | | |
|---|---|---|
| *H01L 29/76* | (2006.01) | |
| *H01L 21/02* | (2006.01) | |
| *H01L 21/311* | (2006.01) | |
| *H01L 21/3213* | (2006.01) | |
| *H01L 21/56* | (2006.01) | |
| *H10D 62/10* | (2025.01) | |
| *H10D 84/01* | (2025.01) | |
| *H10D 84/03* | (2025.01) | |

(52) U.S. Cl.
CPC ..... *H10D 84/038* (2025.01); *H01L 21/02617* (2013.01); *H01L 21/31144* (2013.01); *H01L 21/3213* (2013.01); *H01L 21/56* (2013.01); *H10D 62/115* (2025.01); *H10D 84/0151* (2025.01)

(58) Field of Classification Search
CPC ............... H10D 84/038; H10D 62/115; H10D 84/0151; H10D 62/116; H01L 21/02617; H01L 21/31144; H01L 21/3213; H01L 21/56; H01L 21/3085; H01L 21/76229; H01L 21/3086; H01L 21/76232
USPC .......................................................... 257/213
See application file for complete search history.

(56) References Cited

U.S. PATENT DOCUMENTS

| | | | |
|---|---|---|---|
| 6,294,458 B1 * | 9/2001 | Zhang ............... | H01L 21/76807 438/643 |
| 2020/0168450 A1 * | 5/2020 | Lin ................... | H01L 21/76843 |

* cited by examiner

*Primary Examiner* — Theresa T Doan
(74) *Attorney, Agent, or Firm* — Ingrassia Fisher & Lorenz, LLP

(57) ABSTRACT

Provided are device with stepped isolation regions and methods for fabricating the same. An exemplary method includes forming mask segments over a semiconductor material; etching the semiconductor material to form first trenches, wherein the first trenches have a first trench maximum width and a first trench depth; forming a coating in the first trenches, wherein the coating has a coating depth less than the first trench depth, and wherein uncovered portions of the semiconductor material extend from the coating to the patterned masks; performing an etch process to etch the mask segments and the uncovered portions of the semiconductor material to form second trenches over the first trenches, wherein the second trenches have a second minimum width greater than the first maximum width and a second depth less than the first depth; and removing the coating from the first trenches.

20 Claims, 9 Drawing Sheets

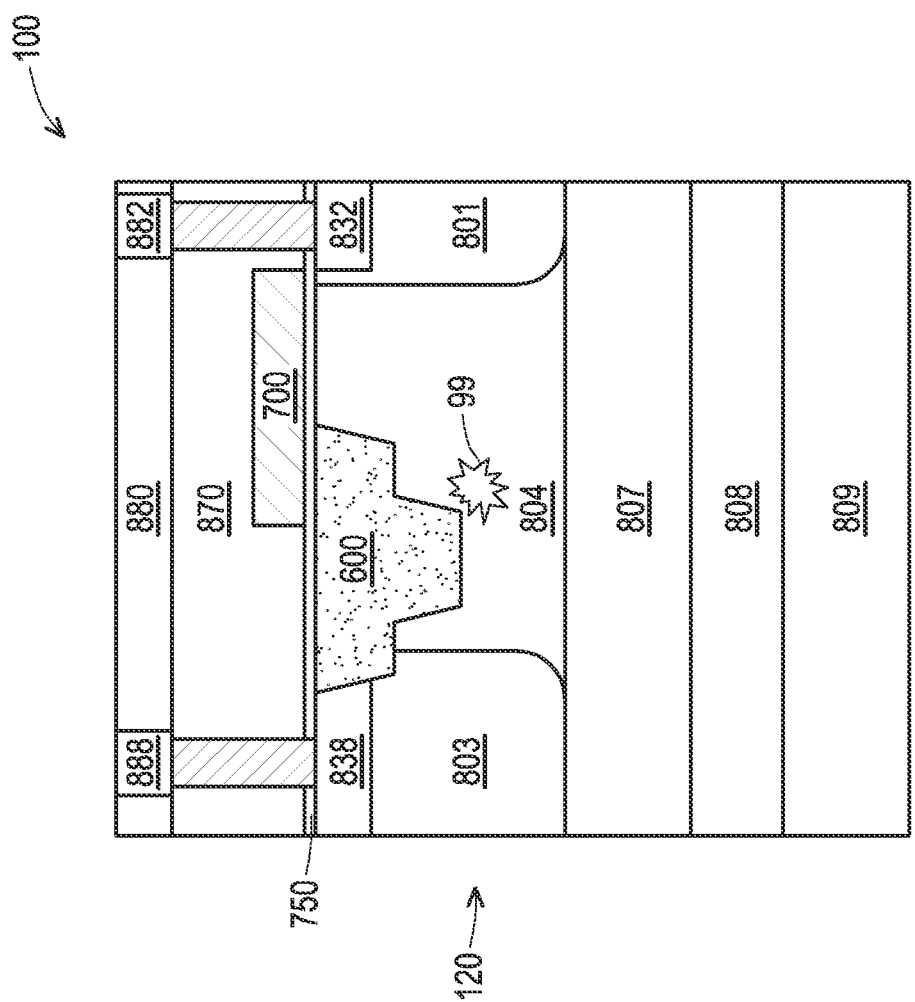

STEPPED ISOLATION REGIONS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Bipolar/CMOS/DMOS (BCD) devices include a bipolar region to perform analog functions, a complementary metal oxide semiconductor (CMOS) region to perform digital functions and a double diffused metal oxide semiconductor (DMOS) region which include power and high-voltage elements to provide power. BCD devices are used in communications applications such as in smart phones and tablets as well as in automotive application, e.g. for mirror positioning, seat adjustment, etc. By integrating three distinct types of components on a single die, BCD technology may reduce the number of components in the bill of materials (BoM). Fewer chip components in the BoM further reduces the area on the board, thus driving down costs. However, integrating different types of components that operate at different voltages can present challenges in electrical isolation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is another focused view of the power device region of FIG. 7 illustrating further processing.

DETAILED DESCRIPTION

Figure 1:
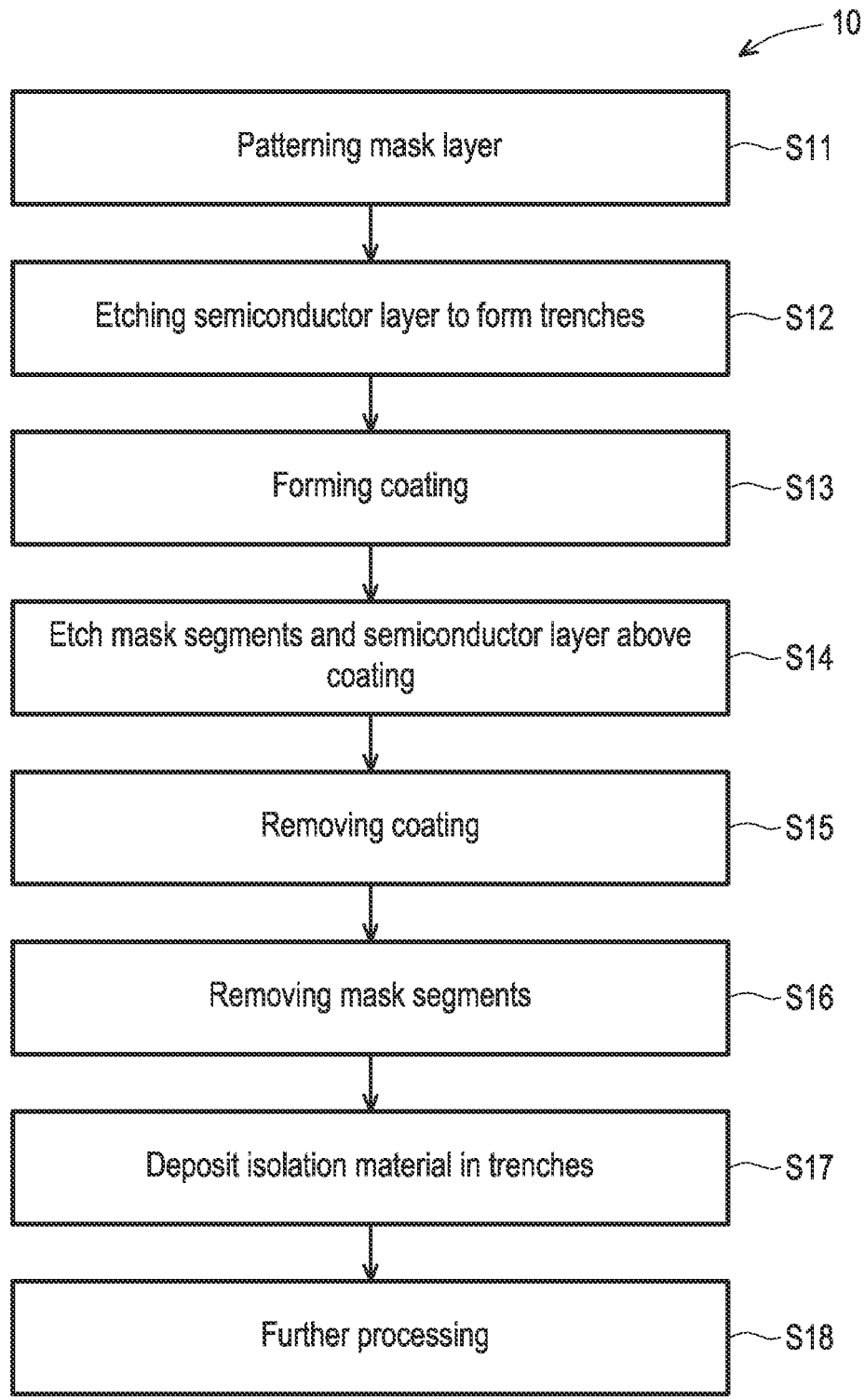
FIG. 1 is a flow chart illustrating a method, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material layer" is a layer that includes at least 51 wt. % of the identified material, for example at least 60 wt. % of the identified material, or at least 75 wt. % of the identified material, or at least 90 wt. % of the identified material; and a layer that is a "material" includes at least 51 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 51 wt. %, at least 60 wt. %, at least 75 wt. %, titanium nitride, or at least 90 wt. % titanium nitride.

As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

It is also noted that this disclosure describes certain embodiments in the form of Bipolar/CMOS/DMOS (BCD) devices, embodiments more generally relate to power devices in which impact ionization may be an issue. Further, this disclosure is drawn to embodiments in which a power device area and a logic area are formed over a substrate during a semiconductor fabrication process.

Embodiments of the present disclosure offer advantages over the existing art, though it is understood that other embodiments may offer different advantages, not all advantages are necessarily discussed herein, and no particular advantage is required for all embodiments. In conventional devices, higher impact ionization generated near the corner of shallow trench isolation (STI) regions result in worse device performance and reliability. Embodiments described herein include power devices with shallow trench isolation (STI) regions and methods for forming shallow trench isolation (STI) regions in power devices that enhance immunity of impact ionization damage. For example, shallow trench isolation (STI) regions may be formed with a profile designed to relax hot carrier generation. Further, embodiments discussed herein provide for efficient cost utilization by integrating process steps for forming the described shallow trench isolation (STI) regions with no additional mask.

Devices and methods for fabricating devices with improved immunity to impact ionization are described in relation to the Figures. It is understood that each method includes steps having features of a complementary metal-oxide-semiconductor (CMOS) technology process flow and thus, are only described briefly herein. Also, additional steps may be performed before, after, and/or during each method.

For purposes of the discussion that follows, FIG. 1 provides flow chart illustrating a method 10 for fabricating a semiconductor device 100, in accordance with various embodiments. It is understood that method 10 includes steps having features of a complementary metal-oxide-semiconductor (CMOS) technology process flow and thus, are only described briefly herein. Also, additional steps may be performed before, after, and/or during method 10.

Method 10 is described below with reference to FIGS. 2-8 which illustrate the semiconductor device 100 at various stages of fabrication according to method 10. FIGS. 2-8 provide cross-sectional views of an embodiment of the semiconductor device 100. In various embodiments, the device 100 may be a Bipolar/CMOS/DMOS (BCD) device, including a power device region 200 and a logic region 300.

Figure 2:
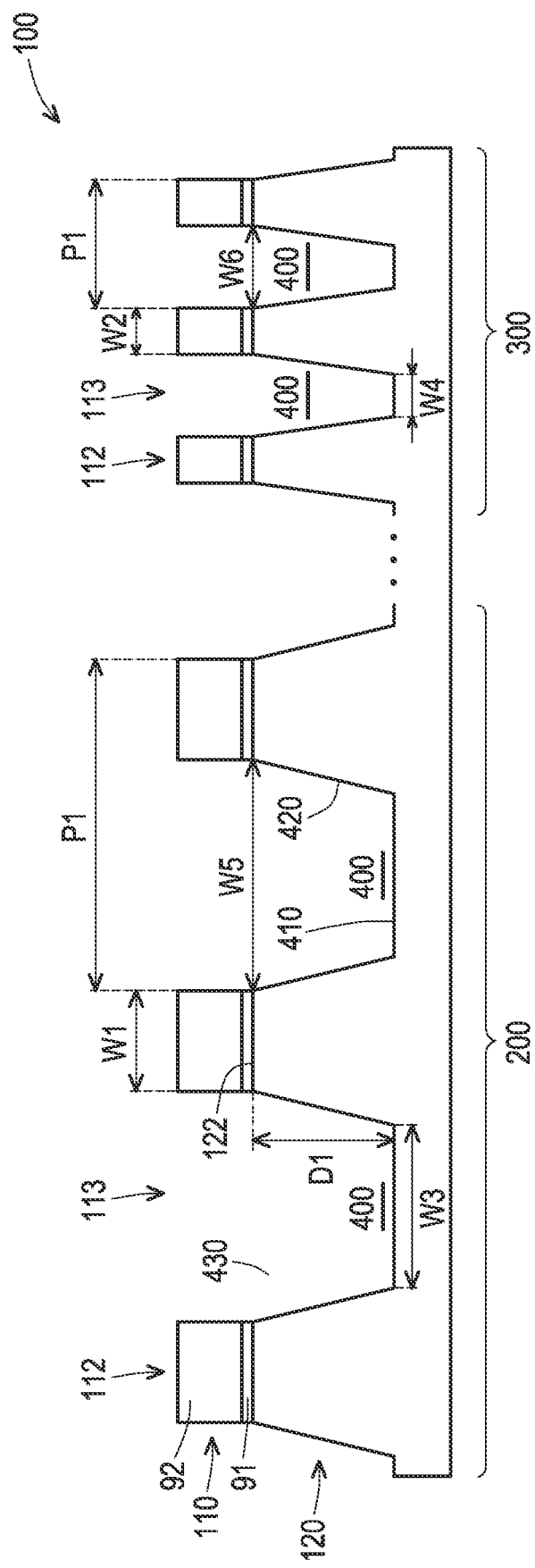
FIGS. 2-7 are cross-sectional views of a device during successive stages of fabrication of the method of FIG. 1, in accordance with some embodiments.

Cross-referencing FIGS. 1 and 2, method 10 includes, at S11, patterning a mask layer 110 over a semiconductor layer 120 to form patterned mask segments 112. In some embodiments, the semiconductor layer 120 may be a semiconductor substrate such as a silicon substrate. The semiconductor layer 120 may include various layers. The semiconductor layer 120 may include various doping configurations depending on design requirements as is known in the art. The semiconductor layer 120 may also include other semiconductors such as germanium, silicon carbide (SiC), silicon germanium (SiGe), or diamond. Alternatively, the semiconductor layer 120 may include a compound semiconductor and/or an alloy semiconductor. Further, the semiconductor layer 120 may optionally include an epi layer, may be strained for performance enhancement and/or have other suitable enhancement features.

As shown, the mask layer 110 may include sublayers, such as an underlying pad oxide layer 91 and an overlying silicon nitride layer 92. An exemplary patterning process includes a lithography process and a photoresist stripping process. The patterning process results in the formation of patterned mask segments 112 across the power device region 200 and the logic region 300. As shown, the patterned mask segments 110 may include sublayers, such as the underlying pad oxide layer 91 and the overlying silicon nitride layer 92.

As shown, the patterned mask segments 112 may be formed with a different critical dimension or lateral width in the power device region 200 and the logic region 300. For example, the patterned mask segments 112 may have a lateral width W1 in the power device region 200 and a lateral width W2 in the logic region 300. In exemplary embodiments, lateral width W1 is greater than lateral width W2. Further, the patterned mask segments 112 may be formed with a different pitch in the power device region 200 and the logic region 300. For example, the patterned mask segments may have a pitch P1 in the power device region 200 and a pitch P2 in the logic region 300. In exemplary embodiments, pitch P1 is greater than pitch P2. In other words, more mask segments 112 are formed in a given area in the logic region 300 as compared to an area of the same size in the power device region 200. Further, the mask segments 112 are separated from one another by gaps 113. In exemplary embodiments, the gaps 113 are larger, i.e., have greater lateral widths, in the power device region 200 than in the logic region 300.

Method 10 may continue, at S12, with etching the semiconductor layer 120 to form trenches 400. As shown, the trenches 400 in the power device region 200 are formed with a bottom surface 410 having a critical dimension or lateral width W3. Likewise, the trenches 400 in the logic region 300 are formed with a bottom 410 having a critical dimension or lateral width W4. As shown, lateral width W3 is greater than lateral width W4. As shown, the trenches 400 are formed with a vertical depth D1 in both the power device region 200 and the logic region 300. The vertical depth D1 extends from a top surface 122 of the semiconductor layer 120 to the trench bottom surface 410

Trenches 400 have sloping sidewalls 420 that extend upward (in a Z-direction) and outward (in an X-direction) away from the bottom surface 410 to an upper opening 430 formed at the surface 122 of the semiconductor layer 120. As shown, the upper openings 430 of the trenches 400 in the power device region 200 are formed with a critical dimension or lateral width W5. Likewise, the upper openings 430 of the trenches 400 in the logic region 300 are formed with a critical dimension or lateral width W6. As shown, lateral width W5 is greater than lateral width W6. In each region 200 and 300, the lateral width W5 or lateral width W6 is the maximum lateral width of the trench 400. In other words, the upper opening 430 is the widest part of each trench 400.

After etching the semiconductor layer 120 to form trenches 400, method 10 may include performing a polymer wet dip and Caro's strip process to remove photoresist. For example, the device 100 may be dipped in a polymer, leaving a residue that is then removed by dipping the device 100 in a Caro's solution. In exemplary embodiments, the Caro's solution is composed of sulfuric acid ($H_2SO_4$) having a concentration of 95 to 98% and hydrogen peroxide ($H_2O_2$) having a concentration of 30 to 40%. The ratio of $H_2SO_4$ to $H_2O_2$ is 4 to 1. The Caro's dip removes all of the residue resulting in a clean silicon wafer surface.

Figure 3:
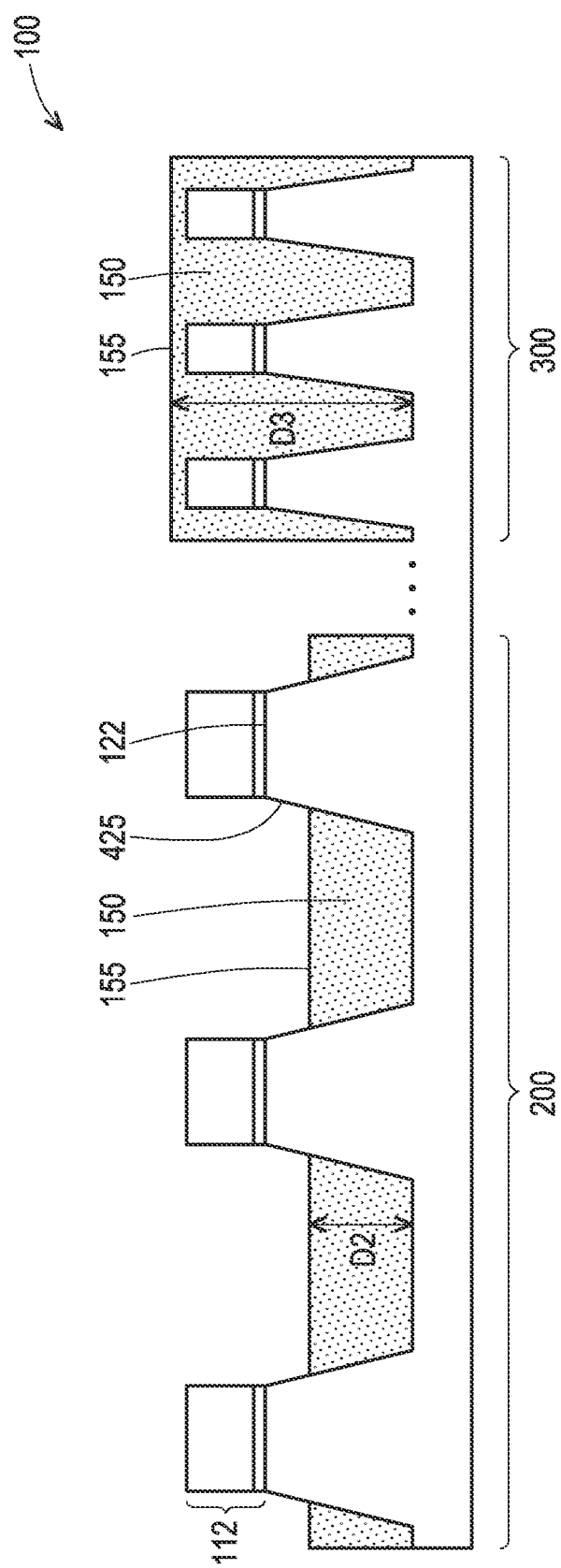

Cross-referencing FIGS. 1 and 3, method 10 may continue, at S13, with forming a coating 150 over the device 100.

As shown, the coating 150 is formed with a top surface 155. In exemplary embodiments, the coating 150 is formed over both the power device region 200 and the logic region 300. With the reduced pitch P2, narrower lateral width W4, and narrower lateral width W6 in the logic region 300, the coating 150 fills the trenches 400 in the logic region 300. In exemplary embodiments, the top surface 155 of the coating 150 is higher than the upper opening 430 of the trenches 400 in the logic region 300. In exemplary embodiments, the top surface 155 of the coating 150 is higher than the patterned mask segments 112 in the logic region 300, such that the coating 150 covers the patterned mask segments 112 in the logic region 300. More specifically, the coating 150 covers the top surface of the overlying silicon nitride layer 92 of the patterned mask segments 112 in the logic region 300. In exemplary embodiments, the coating 150 has a vertical depth D3, from the bottom 410 to the top surface 155, in the logic region 300 that is greater than the vertical depth D1 of the trench 400.

With the larger pitch P1, wider lateral width W3, and wider lateral width W5 in the power device region 200, the coating 150 only partially fills the trenches 400 in the power device region 200 such that the top surface 155 of the coating 150 is located below the upper opening 430 of the trenches 400 in the power device region 200. In exemplary embodiments, the coating 150 has a vertical depth D2, from the bottom 410 to the top surface 155, in the power device region 200 that is less than the vertical depth D1 of the trench 400. In exemplary embodiments, vertical depth D2 is from about one-third to two-thirds of vertical depth D1. Thus, in the power device region 200, upper portions 425 of sidewalls 420 of trenches 400, formed by the semiconductor layer 120, are not covered, i.e., are uncovered, by the coating 150. The uncovered portions 425 of the semiconductor layer 120 extend from the top surface 155 of the coating 150 to the patterned mask segments 112. More specifically, the uncovered portions 425 of the semiconductor layer 120 extend from the top surface 155 of the coating 150 to the underlying pad oxide layer 91 of the patterned mask segments 112.

In exemplary embodiments, the coating 150 is a photoresist material, through other materials may be suitable. For example, the photoresist may be a positive-tone or negative-tone resist. In an embodiment, the photoresist is chemical amplified photoresist (CAR). The photoresist may include a polymer, a photoacid generator (PAG), which provides the solubility change to the developer, a solvent, and/or other suitable compositions. The photoresist may be formed by processes such as coating (e.g., spin-on coating) and soft baking.

In certain embodiments, formation of the coating 150 may include patterning the photoresist. For example, the method may use various and/or varying wavelengths of radiation to expose the energy-sensitive photoresist layer. In an embodiment, the mask is irradiated using ultraviolet (UV) radiation or extreme ultraviolet (EUV) radiation. The radiation beam may additionally or alternatively include other radiation beams such as ion beam, x-ray, extreme ultraviolet, deep ultraviolet, and other proper radiation energy. In an example, the photoresist includes photo-acid generator (PAG) that generates acid during the exposure process thus changing the solubility of the exposed/non-exposed material. Lithography processes include immersion lithography, photolithography, optical lithography and/or other patterning methods which may transfer a pattern onto the photosensitive layer. Patterning may further include a post-exposure bake (PEB) process. During the baking process, the photoresist layer is provided at an elevated temperature. This may allow more acid to be generated from the photo-generated acids through a chemical amplification process. Further, patterning may include developing the photoresist. The developing may form a patterned photoresist layer including a plurality of masking elements or features. During the developing process, a developing solution is applied to the photoresist layer. In one embodiment, the photoresist material that was exposed to the radiation is removed by the developing solution (developer). However, implementing a negative-tone resist is also possible. The developer or developing solution may be a positive tone developer or negative tone developer. One exemplary developer is aqueous tetramethylammonium hydroxide (TMAH). In exemplary embodiments, the coating 150 is hardened through the selected formation process.

Figure 4:
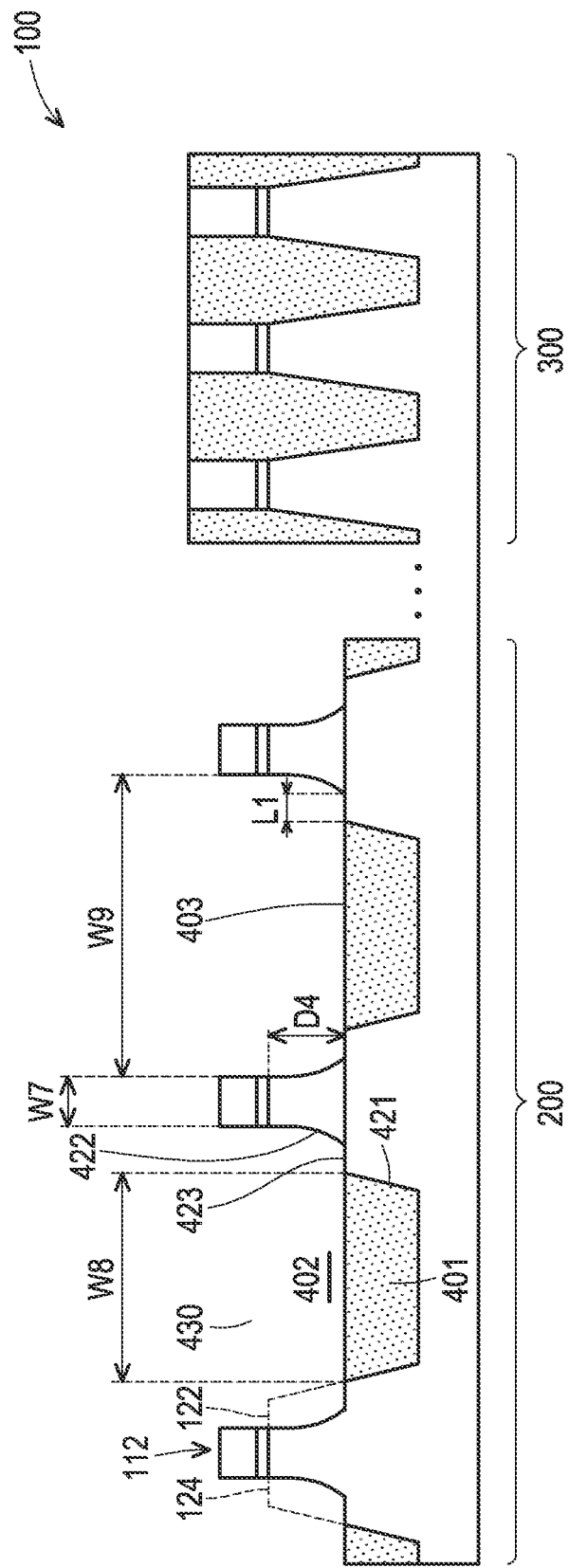

Cross-referencing FIGS. 1 and 4, method 10 may continue, at S14, with etching the mask segments 112 and the uncovered portions 425 of the semiconductor layer 120 to widen an upper portion 402 of the trenches 400 in the power device region 200. During this etch process, the coating 150 remains covering the logic region 300, thereby preventing etching of any structure under the coating 150 in the logic region 300.

In exemplary embodiments, method 10, at S14, performs an isotropic etch process to etch the mask segments 112 and the uncovered portions 425 of the semiconductor layer 120. In exemplary embodiments, the isotropic etch process is a self-aligned process. In exemplary embodiments, the isotropic etch process is a dry etch process. The isotropic etch process may be referred to as a SiN hard mask/Si sidewall pull-back process. During the isotropic etch process, a stepped or stair profile is formed in the substrate 120 by etching the sidewall of the silicon substrate 120 that is not covered by the coating 150. The isotropic etch process consumes the mask segments 112 at the top-side of the overlying silicon nitride layer 92, at the sidewall of the overlying silicon nitride layer 92, and at the sidewall of the underlying pad oxide layer 91.

Thus, as shown in FIG. 4, an exemplary isotropic etch process etches the mask segments 112, including both the underlying pad oxide layer 91 and the overlying silicon nitride layer 92, in the lateral X-direction and in the vertical Z-direction. As a result, the etched mask segments 112 have a reduced lateral width W7 (in the X-direction). Etching the mask segments 112 in the lateral X-direction results in uncovering an additional portion 124 (shown in phantom in FIG. 4) of the semiconductor layer 120 at the top surface 122 of the semiconductor layer 120.

An exemplary isotropic etch process further etches the semiconductor layer 120. Specifically, the uncovered portions 425 and the additional portion 124 of the semiconductor layer 120 are etched in the lateral X-direction and in the vertical Z-direction. As a result, the opening 430 and an upper portion 402 of the trench 400 are widened.

The portion of the trench 400 filled by the coating 150 may be considered to be a lower portion 401 of the trench 400. Further, the portion of the sidewall 420 covered by the coating 150 may be considered to be a lower sidewall 421.

After the etching process, the upper portion 402 of the trench 400 extends between opposite upper sidewalls 422. In addition to the lower sidewall 421 and the upper sidewall 422, each sidewall 420 includes a substantially lateral or horizontal extending (in the X-direction) shoulder portion 423. The shoulder 423 is formed along an interface 403 between the lower portion 401 and the upper portion 402 of the trench 400. Each shoulder 423 interconnects respective lower sidewalls 421 and upper sidewalls 422. In exemplary embodiments, each shoulder 423 has a lateral or horizontal length L1 equal to one-third to two-thirds of the trench depth D1.

The lower portion 401 of the trench 400 is formed with a lateral width W8 at the interface 403. In exemplary embodiments, the lateral width W8 is the widest part of the lower portion 401 of the trench 400. Thus, the lateral width W8 is a maximum lateral width of the lower portion 401 of the trench 400.

In exemplary embodiments, the upper sidewalls 422 are sloping such that the upper sidewalls 422 extend upward (in a Z-direction) and outward (in an X-direction) away from the shoulder 423 to the widened upper opening 430 formed at the surface 122 of the semiconductor layer 120. The widened upper opening 430 has a lateral width W9. In region 200, the lateral width W9 is the maximum lateral width of the trench 400. In other words, the widened upper opening 430 is the widest part of the upper portion 402 of the trench 400.

The upper portion 402 of the trench 400 is formed with a lateral width W10 (shown in FIG. 5) at the interface 403. In an exemplary embodiment, lateral width W10 is equal to the sum of lateral length L1, lateral width W8, and lateral length L1. In exemplary embodiments, the lateral width W10 is the narrowest part of the upper portion 402 of the trench 400. Thus, the lateral width W10 is a minimum lateral width of the upper portion 402 of the trench 400.

Further, upper portion 402 of the trench 400 is formed with a vertical depth D4 from the interface 403 or shoulder 423 to the opening 430. In exemplary embodiments, the vertical depth D4 of the upper portion 402 is from one-third to two-thirds of the initial or total trench depth D1.

Thus, each sidewall 420 has a stepped profile from the bottom surface 410 to the widened opening 430 and includes a lower sidewall 421, an upper sidewall 422, and a shoulder 423 extending between and interconnecting the lower sidewall 421 and the upper sidewall 422. The stepped sidewalls 420 provide for improved isolation as described below.

In certain embodiments, the lower portion 401 of the trench 400 may be considered to be a lower trench 401 and the upper portion 402 of the trench 400 may be considered to be an upper trench 402. A combined trench 400 is formed by the combination of the lower trench 401 and the upper trench 402.

Figure 5:
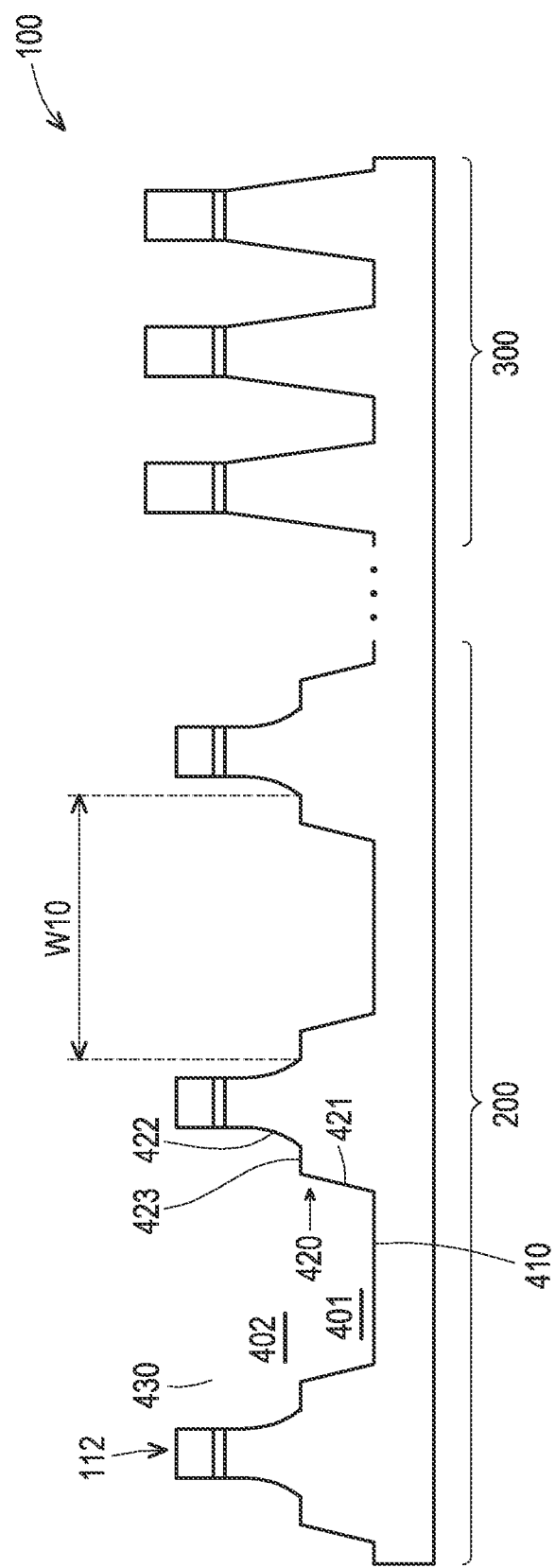

Cross-referencing FIGS. 1 and 5, method 10 may continue, at S15, with removing the coating from the device 100. Specifically, the coating 150 is removed from power device region 200, including from trenches 400, and from the logic region 300. In exemplary embodiments in which the coating 150 is a photoresist material, the coating 150 may be removed by a strip process. For example, method 10 may include performing a polymer wet dip and Caro's strip process to remove the photoresist. For example, the device 100 may be dipped in a polymer, leaving a residue that is then removed by dipping the device 100 in a Caro's solution. In exemplary embodiments, the Caro's solution is composed of sulfuric acid ($H_2SO_4$) having a concentration of 95 to 98% and hydrogen peroxide ($H_2O_2$) having a concentration of 30 to 40%. The ratio of $H_2SO_4$ to $H_2O_2$ is 4 to 1. The Caro's dip removes all of the residue resulting in a clean silicon wafer surface.

Figure 6:
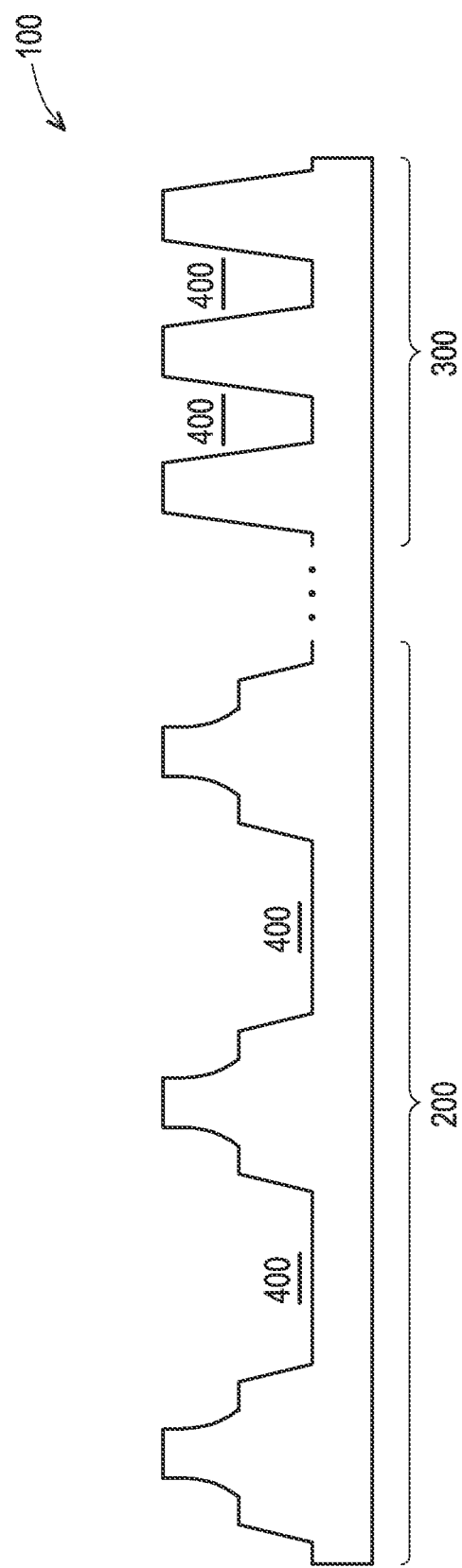

Cross-referencing FIGS. 1 and 6, method 10 may continue, at S16, with removing the patterned masks 112 from the device 100. Specifically, the remaining portions of the underlying pad oxide layer 91 and the overlying silicon nitride layer 92 are removed.

Figure 7:
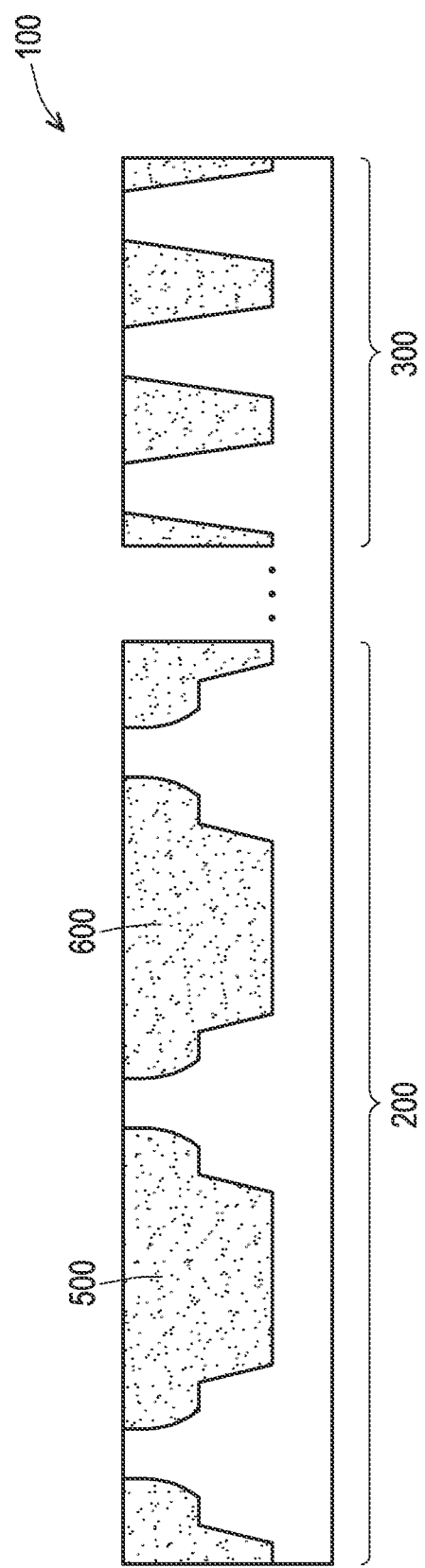

Cross-referencing FIGS. 1 and 7, method 10 may continue, at S17, with depositing isolation material 500 in each trench 400 and performing a chemical mechanical planarization (CMP) process to planarize the isolation material 500 to level with the top surface of the semiconductor layer 120 to form isolation regions, such as shallow trench isolation (STI) regions 600. In certain embodiments, a liner may be formed on the trench surfaces and annealed before additional isolation material is deposited to fill the trenches 400.

Figure 8:
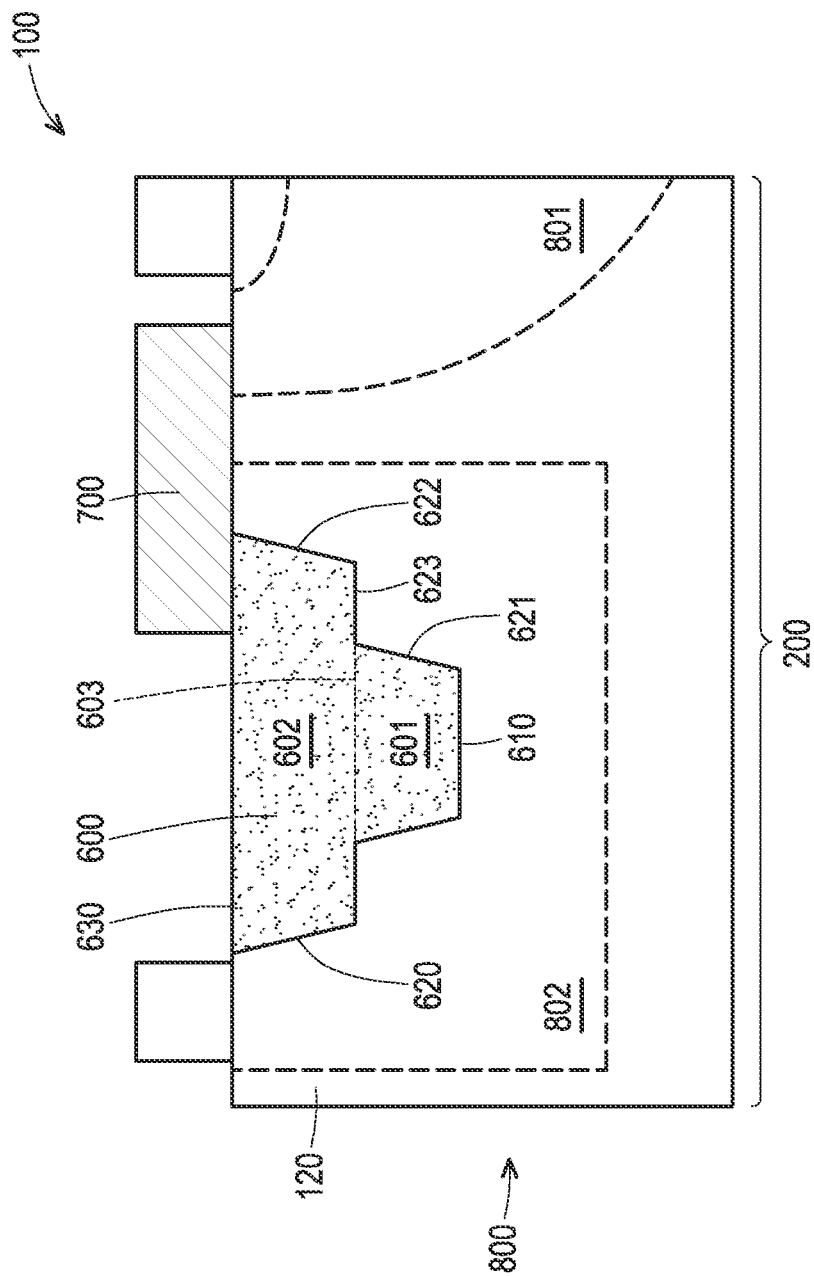
FIG. 8 is a focused view of the power device region of FIG. 7 illustrating further processing.

Cross-referencing FIGS. 1 and 8, method 10 may continue, at S18, with further processing. It is noted that FIG. 7 is a cross-sectional view focused on a portion of the power device region 200. In the power device region 200, method 10 may form a gate 700 over the semiconductor layer 120 and at least partially directly over the respective shallow trench isolation (STI) region 600. Further, method 10 may form a plurality of doped semiconductor regions 800 in the semiconductor layer 120. In exemplary embodiments, the doped semiconductor regions include a source-side doped well region 801 having a doping of a first conductivity type and a drift region 802 having a doping of a second conductivity type opposite the first conductivity type. In exemplary embodiments, a respective shallow trench isolation (STI) region 600 is located within the drift region 802.

In FIG. 8, the exemplary shallow trench isolation (STI) region 600 has a lower portion 601 with a lateral width and an upper portion 602 with a lateral width that is greater than the lateral width of the lower portion 601. The lower portion 601 abuts the upper portion 602 at an interface 603.

As shown, the exemplary shallow trench isolation (STI) region 600 has stepped sidewall surfaces 620 that extend from a bottom surface 610 to a top surface 630. The sidewall surfaces 620 include a lower wall surface 621 contacting the bottom surface 610, an upper wall surface 622 contacting the top surface 630, and a laterally-extending shoulder surface 623 interconnecting the lower wall surface 621 and the upper wall surface 622. In exemplary embodiments, the shoulder surface 623 extends from the lower wall surface 621 to the upper wall surface 622 along a lateral distance equal to lateral length L1 (in FIG. 4) and that is equal to one-third to two-thirds of the total depth of the shallow trench isolation (STI) region 600.

The lower wall surfaces 621 bound the lower portion 601 of the shallow trench isolation (STI) region 600. The upper wall surfaces 622 bound the upper portion 602 of the shallow trench isolation (STI) region 600.

As shown, the shallow trench isolation (STI) region 600 has a total depth extending vertically from the bottom surface 610 to the top surface 630 that is equal to depth D1 (in FIG. 2). In exemplary embodiments, the interface 603 is located at a depth from the top surface 630 that is equal to depth D4 (in FIG. 4). In exemplary embodiments, the depth of the interface 603 is equal to one-third to two-thirds of the total depth of the shallow trench isolation (STI) region 600.

In exemplary embodiments, the lower portion 601 of the shallow trench isolation (STI) region 600 has a bottom lateral width at the bottom surface 610 that is equal to lateral width W3 (shown in FIG. 2). In exemplary embodiments, the lower portion 601 of the shallow trench isolation (STI) region 600 has an intermediate lateral width at the interface 603 that is equal to lateral width W8 (in FIG. 4). In exemplary embodiments, the intermediate lateral width is greater than the bottom lateral width. In exemplary embodiments, the upper portion 602 of the shallow trench isolation (STI) region 600 has a stepped lateral width at the interface 603 that is equal to lateral width W10 (in FIG. 5). In exemplary embodiments, the stepped lateral width is greater than the intermediate lateral width of the lower portion 601 of the shallow trench isolation (STI) region 600. In exemplary embodiments, the upper portion 602 of the shallow trench isolation (STI) region 600 has a top lateral width at the top surface 630 that is equal to lateral width W9 (in FIG. 4). In exemplary embodiments, the top lateral width is greater than the stepped lateral width.

FIG. 9 provides another cross-section view of a portion of a power device region 200 of a device 100 according to certain embodiments. As shown, the device 100 includes a semiconductor layer 120, a shallow trench isolation (STI) region 600 formed in the semiconductor layer 120, and a gate 700 at least partially overlying the shallow trench isolation (STI) region 600. The device 100 further includes a drain-side doped well 803, a source-side doped well 801, and an intermediate doped well 804, all formed in the semiconductor layer 120.

As shown the semiconductor layer 120 may include or be located over a buried doped semiconductor layer 807, a buried insulating layer 808, and a semiconductor substrate 809.

As further shown, a source region 832 may be located in the semiconductor layer 120, such as within the source-side doped well region 801. Also, a drain region 838 may be located in the semiconductor layer 120, such as within the drain-side doped well region 803.

As shown, a gate dielectric layer 750 may be disposed over the top surface of the semiconductor layer 120 and over the shallow trench isolation (STI) region 600. As shown, the gate 700, including gate electrode material, may be located on the gate dielectric layer 750. Further, a dielectric layer 870, such as an interlayer dielectric, is located over the gate dielectric layer 750. A source interconnect structure 882 and a drain interconnect structure 888 are formed over and through the dielectric layer 870 for electrical interconnection to the source 832 or drain 838, respectively.

FIG. 9 illustrates a hot carrier region 99 in an exemplary device 100 according to an embodiment of the present disclosure. The volume of hot carrier region 99 is significantly reduced due to the stepped profile of the shallow trench isolation (STI) region 600.

As shown in FIG. 9, the method 10 described herein may result in the formation of shallow trench isolation (STI) regions 600 over power device regions 200 and a logic regions 300. Further, as described herein, method 10 provides for forming shallow trench isolation (STI) regions 600 having different shapes or profiles in different device regions. Specifically, the method 10 described herein may form shallow trench isolation (STI) regions 600 having stepped sidewalls 420 in power device regions 200, and, simultaneously, form shallow trench isolation (STI) regions 600 that do not have stepped sidewalls in logic regions 300. In exemplary embodiments, the method 10 described herein forms shallow trench isolation (STI) regions 600 having relatively wider lateral bottom widths in power device regions 200 and simultaneously forms shallow trench isolation (STI) regions 600 having relatively narrower lateral bottom widths in logic regions 300. In exemplary embodiments, the method 10 described herein forms shallow trench isolation (STI) regions 600 having relatively wider lateral top widths in power device regions 200 and simultaneously forms shallow trench isolation (STI) regions 600 having relatively narrower lateral bottom widths in logic regions 300. In exemplary embodiments, the method 10 described herein forms shallow trench isolation (STI) regions 600 having a same vertical depth or height in power device regions 200 and in logic regions 300.

Further, the method 10 described herein results in the formation of shallow trench isolation (STI) regions 600 over power device regions 200 that have a stepped sidewall, a lower portion with a maximum width, and an upper portion with a minimum width greater than the maximum width of the lower portion. In other words, in the power device regions 200, the width of the upper portion of the shallow trench isolation (STI) regions 600 at the interface with the lower portion of the shallow trench isolation (STI) regions 600, i.e., the minimum width of the upper portion of the shallow trench isolation (STI) regions 600, is not equal to the width of the lower portion of the shallow trench isolation (STI) regions 600 at the interface with the upper portion of the shallow trench isolation (STI) regions 600, i.e., the maximum width of the lower portion of the shallow trench isolation (STI) regions 600. This is unlike the shallow trench isolation (STI) regions 600 in logic regions 300. In logic regions 300, the minimum width of any upper portion of the shallow trench isolation (STI) regions 600 is equal to the width of the lower portion of the shallow trench isolation (STI) regions 600 at the interface therebetween. In other words, there is no laterally-extending shoulder surface in the shallow trench isolation (STI) regions 600 in logic regions 300.

Thus, one of the embodiments of the present disclosure describes a method for fabricating a semiconductor structure. The method includes forming mask segments over a semiconductor material; etching the semiconductor material to form first trenches, wherein the first trenches have a first trench maximum width and a first trench depth; forming a coating in the first trenches, wherein the coating has a coating depth less than the first trench depth, and wherein uncovered portions of the semiconductor material extend from the coating to the mask segments; performing an isotropic etch process to etch the mask segments and the uncovered portions of the semiconductor material to form second trenches over the first trenches, wherein the second trenches have a second minimum width greater than the first maximum width and a second depth less than the first depth; and removing the coating from the first trenches.

In certain embodiments of the method, each pair of respective first trenches and second trenches form a combined trench having a stepped sidewall. In such embodiments, the method may further include depositing isolation material in each combined trench to form isolation regions.

In certain embodiments of the method, the second trench depth is from one-third to two-thirds of the first trench depth.

In certain embodiments of the method, each pair of respective first trenches and second trenches form a combined trench having a stepped side wall including a lower surface bounding the first trench, an upper surface bounding the second trench, and a laterally extending shoulder surface connecting the lower surface and the upper surface. In such embodiments, each shoulder surface may have a lateral length equal to one-third to two-thirds of the first trench depth.

In another embodiment, a method for fabricating a semiconductor structure includes forming a mask layer over a semiconductor material in a first region and in a second region of a substrate; patterning the mask layer to form patterned mask segments, wherein in the first region the patterned masks are separated by first gaps and in the second region the patterned masks are separated by second gaps smaller than the first gaps; etching the semiconductor material to form first trenches in the first region and in the second region; forming a coating over the first region and the second region, wherein, in the first region, the coating partially fills the first trenches, and wherein, in the second region, the coating fills the second gaps and covers the semiconductor material; and etching the mask segments and uncovered portions of the semiconductor material to widen an upper portion of the first trenches in the first region while the coating covers the second region.

In certain embodiments of the method, the first trenches in the first region have a first depth, and the upper portion has a second depth equal to one-third to two-thirds of the first depth.

In certain embodiments of the method, after patterning the mask layer to form the patterned mask segments, the patterned mask segments in the first region have a first mask width, and the patterned mask segments in the second region have a second mask width less than the first mask width.

In certain embodiments of the method, after forming the coating, the coating covers the patterned mask segments in the second region.

In certain embodiments of the method, etching the portions of the semiconductor material includes performing an isotropic etch to etch the patterned mask segments laterally to uncover semiconductor material under the mask segments, and the patterned mask segments are etched to a reduced width.

In certain embodiments of the method, the first region is a power device region and the second region is a logic region.

In certain embodiments, the method further includes depositing an isolation material in the first trenches in the first region to form shallow trench isolation (STI) regions; forming a plurality of doped semiconductor regions in the semiconductor material, wherein the plurality of doped semiconductor regions include a source-side doped well region having a doping of a first conductivity type and a drift region having a doping of a second conductivity type opposite the first conductivity type, wherein a respective STI region is located within the drift region; and forming a gate over the semiconductor substrate and at least partially directly over the respective STI region.

In another embodiment, a semiconductor device is provided. The semiconductor device includes a semiconductor layer; a shallow trench isolation (STI) region having a stepped sidewall, wherein the STI region has a lower portion with a first width and an upper portion with a second width greater than the first width; and a gate at least partially overlying the STI region.

In certain embodiments, the stepped sidewall includes a lower wall surface bounding the lower portion of the STI region and an upper wall surface bounding the upper portion of the STI region, and a laterally extending shoulder surface connecting the lower wall surface and the upper wall surface.

In certain embodiments, the STI region has a total depth extending vertically from a bottom surface to a top surface; the lower portion abuts the upper portion at an interface; the lower portion of the STI region has a bottom width at the bottom surface; the lower portion of the STI region has an intermediate width at the interface, wherein the intermediate width is greater than the bottom width; the upper portion of the STI region has a stepped width at the interface, wherein the stepped width is greater than the intermediate width; and the upper portion of the STI region has a top width at the top surface, wherein the top width is greater than the stepped width. In certain embodiments, the interface is located at a first depth from the top surface, wherein the first depth is equal to one-third to two-thirds of the total depth. In certain embodiments, the shoulder surface extends from the lower wall surface to the upper wall surface along a lateral distance, and the lateral distance is equal to one-third to two-thirds of the total depth.

In certain embodiments, the STI region includes a first stepped sidewall including a first lower wall surface bounding the lower portion of the STI region and a first upper wall surface bounding the upper portion of the STI region, and a first laterally extending shoulder surface connecting the lower wall surface and the upper wall surface; and a second stepped sidewall including a second lower wall surface bounding the lower portion of the STI region and a second upper wall surface bounding the upper portion of the STI region, and a second laterally extending shoulder surface connecting the second lower wall surface and the second upper wall surface.

In certain embodiments, a drift region having a doping of a conductivity type is formed within the semiconductor layer, and the STI region is surrounded by the drift region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method for fabricating a semiconductor structure, comprising:
    forming mask segments over a semiconductor material;
    etching the semiconductor material to form first trenches, wherein the first trenches have a first trench maximum width and a first trench depth;
    forming a coating in the first trenches, wherein the coating has a coating depth less than the first trench depth, and wherein uncovered portions of the semiconductor material extend from the coating to the mask segments;
    performing an etch process to etch the mask segments and the uncovered portions of the semiconductor material to form second trenches over the first trenches, wherein the second trenches have a second minimum width greater than the first trench maximum width and a second trench depth less than the first trench depth; and
    removing the coating from the first trenches.

2. The method of claim 1, wherein each pair of respective first trenches and second trenches form a combined trench having a stepped sidewall.

3. The method of claim 2, further comprising depositing isolation material in each combined trench to form isolation regions.

4. The method of claim 1, wherein the second trench depth is in a range from one-third to two-thirds of the first trench depth.

5. The method of claim 1, wherein each pair of respective first trenches and second trenches form a combined trench having a stepped side wall including a lower surface bounding the first trench, an upper surface bounding the second trench, and a laterally extending shoulder surface connecting the lower surface and the upper surface.

6. The method of claim 5, wherein each shoulder surface has a length in a range from one-third to two-thirds of the first trench depth.

7. The method of claim 1, wherein the etch process is an isotropic etch process.

8. The method of claim 1, wherein the etch process is an isotropic etch process.

9. The method of claim 1, wherein the coating is a photoresist material, and wherein the photoresist material is a chemical amplified photoresist (CAR).

10. The method of claim 1, wherein the coating depth is in a range from one-third to two-thirds of the first trench depth.

11. The method of claim 1, wherein forming the coating comprises:
    applying a photoresist material over the semiconductor material; and
    hardening the photoresist material through a selected formation process.

12. The method of claim 1, wherein the mask segments comprise:
    an underlying pad oxide layer; and
    an overlying silicon nitride layer.

13. The method of claim 12, wherein performing the etch process comprises etching both the underlying pad oxide layer and the overlying silicon nitride layer in lateral and vertical directions.

14. The method of claim 1, wherein the etch process consumes the mask segments at a top-side, at a sidewall, and reduces a lateral width of the mask segments.

15. The method of claim 1, wherein etching the uncovered portions of the semiconductor material uncovers additional portions of the semiconductor material at a top surface of the semiconductor material.

16. The method of claim 1, wherein the combined trench formed by each pair of respective first trenches and second trenches includes sidewalls having a stepped profile from a bottom surface to a widened opening.

17. The method of claim 3, wherein the isolation material is deposited after removing the coating and removing the mask segments.

18. The method of claim 3, further comprising performing a chemical mechanical planarization (CMP) process to planarize the isolation material to level with a top surface of the semiconductor material.

19. The method of claim 3, wherein depositing the isolation material comprises:
   forming a liner on trench surfaces; and
   annealing the liner before depositing additional isolation material to fill the combined trenches.

20. The method of claim 1, further comprising:
   performing a polymer wet dip and Caro's strip process after etching the semiconductor material to form the first trenches; and
   performing a polymer wet dip and Caro's strip process after removing the coating from the first trenches.

* * * * *